(12) United States Patent  
Halverson et al.

(10) Patent No.: US 7,511,469 B2  
(45) Date of Patent: Mar. 31, 2009

(54) PHASE MEASUREMENT DEVICE USING INPHASE AND QUADRATURE COMPONENTS FOR PHASE ESTIMATION

(75) Inventors: Peter G. Halverson, Temple City, CA (US); Brent Ware, Pasadena, CA (US); Daniel A. Shaddock, Kaleen (AU); Robert E. Spero, La Crescenta, CA (US)

(73) Assignee: California Institute of Technology, Pasadena, CA (US)

( * ) Notice: Subject to any disclaimer, the term of this patent is extended or adjusted under 35 U.S.C. 154(b) by 126 days.

(21) Appl. No.: 11/880,889

(22) Filed: Jul. 24, 2007

(65) Prior Publication Data

US 2008/0224689 A1 Sep. 18, 2008

Related U.S. Application Data

(60) Provisional application No. 60/832,787, filed on Jul. 24, 2006.

(51) Int. Cl.  
*G01R 25/00* (2006.01)  
*G01R 13/00* (2006.01)

(52) U.S. Cl. .................... 324/76.77; 324/76.78; 702/72

(58) Field of Classification Search ............. 324/76.77, 324/76.78; 702/72  
See application file for complete search history.

(56) References Cited

U.S. PATENT DOCUMENTS

| 4,068,210 A * | 1/1978 | Corkhill .................... 367/190 |
| 4,933,916 A * | 6/1990 | May et al. .................. 367/125 |
| 7,227,346 B1 * | 6/2007 | Solbrig ..................... 324/76.78 |
| 2005/0075815 A1 * | 4/2005 | Webster et al. ............. 702/106 |

* cited by examiner

*Primary Examiner*—Timothy J Dole  
*Assistant Examiner*—Amy He  
(74) *Attorney, Agent, or Firm*—Seth Z. Kalson

(57) ABSTRACT

A phasemeter for estimating the phase of a signal. For multi-tone signals, multiple phase estimates may be provided. An embodiment includes components operating in the digital domain, where a sampled input signal is multiplied by cosine and sine terms to provide estimates of the inphase and quadrature components. The quadrature component provides an error signal that is provided to a feedback loop, the feedback loop providing a model phase that tends to track the phase of a tone in the input signal. The cosine and sine terms are generated from the model phase. The inphase and quadrature components are used to form a residual phase, which is added to the model phase to provide an estimate of the phase of the input signal. Other embodiments are described and claimed.

9 Claims, 2 Drawing Sheets

PHASE MEASUREMENT DEVICE USING INPHASE AND QUADRATURE COMPONENTS FOR PHASE ESTIMATION

BENEFIT OF PROVISIONAL APPLICATION

This application claims the benefit of U.S. Provisional Application No. 60/832,787, filed Jul. 24, 2006, which is hereby incorporated by reference.

GOVERNMENT INTEREST

The invention claimed herein was made in the performance of work under a NASA contract, and is subject to the provisions of Public Law 96-517 (35 USC 202) in which the Contractor has elected to retain title.

FIELD

The present invention relates to signal processing and electronic systems, and more particularly, to phase detection of a signal.

BACKGROUND

Estimating the phase of a signal is an important function that finds application in a number of areas, such as in communication and signal processing. One such application in which phase estimation accuracy is important is in experiments for detecting gravity waves, whereby laser signals received from one or more spacecrafts convey information regarding small changes in the relative distances between the spacecrafts. Such changes in the relative distances may indicate gravity waves. For such an application, a locally generated reference laser signal "beats" with the received laser signal to provide a signal comprising a tone having a frequency equal to the difference of the frequencies of the received and locally generated laser signals. This beat tone may be referred to as a heterodyne interference frequency, and the beat signal may be referred to as a heterodyne interference signal. Accurately measuring the phase of the heterodyne interference signal provides information regarding the change in distance between the spacecraft.

DESCRIPTION OF EMBODIMENTS

In the description that follows, the scope of the term "some embodiments" is not to be so limited as to mean more than one embodiment, but rather, the scope may include one embodiment, more than one embodiment, or perhaps all embodiments.

Figure 1:
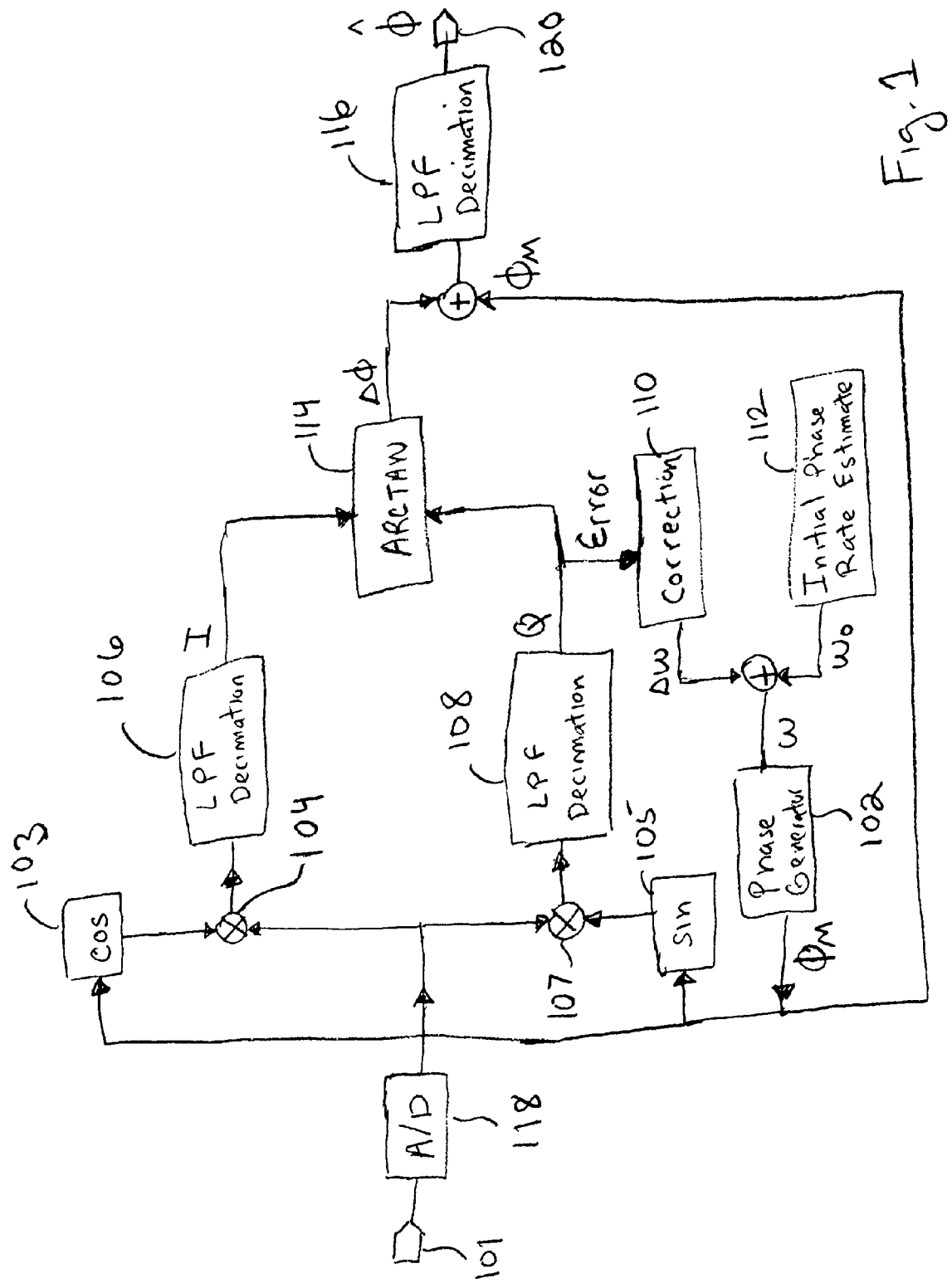
FIG. 1 illustrates a phasemeter according to an embodiment of the present invention.

FIG. 1 illustrates a phasemeter according to an embodiment. An input analog signal is provided to input port 101. The input signal may comprise one or more tones. For the present discussion, assume that the input signal comprises a single tone. (Embodiments for multi-tone input signals will be discussed later.) Under the assumption of a single-tone input signal, the input signal may be viewed as having a phase $\phi$. Output port 120 provides an estimate of this phase, denoted as $\hat{\phi}$.

Although not necessary to the description of the embodiments, it is pedagogically useful to consider the physical significance of the phase term. In practice, the phase $\phi$ may be viewed as the total argument of a sine function, and is a function of time. For example, a single-tone input signal, excluding noise terms, may be written as $A(t)\sin(\phi)$. Here, $\phi$ is referred to as the phase of the input signal. Note that for the pure, single tone $A\sin(\omega t+\phi)$ where $\phi$ is a constant, the phase is $\phi=\omega t+\phi$, so that the time derivative of the phase is $\omega$, the frequency (in radians).

Continuing with the description of the embodiment represented by FIG. 1, the input signal is sampled by analog-to-digital converter 118 to provide a discrete-time, discrete-valued input time series, so that further operations are performed in the digital domain. This input time series is multiplied by two multiplier time series to yield what may be viewed as estimates of the inphase (I) and quadrature (Q) components of the input signal, where in FIG. 1 the signal flow path providing the estimate of the inphase component is labeled with an "I" and the signal flow path providing the estimate of the quadrature component is labeled with a "Q". These two multiplier time series are $\cos(\phi_M)$ and $\sin(\phi_M)$, where $\phi_M$ is a phase term (it is a time series) provided by phase generator 102. In practice, these two multiplier time series are not exactly $\cos(\phi_M)$ and $\sin(\phi_M)$ because once the input analog signal has been digitized, operations may only be performed with finite precision. With this in mind, the multiplier terms $\cos(\phi_M)$ and $\sin(\phi_M)$ will still be used, but it should be appreciated that embodiments will only utilize approximations to these multiplier terms.

Functional unit 103 and multiplier 104 indicate that the input time series is multiplied by $\cos(\phi_M)$, which is then low pass filtered and downsampled by functional unit 106. Some embodiments may not employ downsampling (decimation). For some embodiments, the low pass filter may be a Bartlett filter. Similarly, functional unit 105 and multiplier 107 indicate that the input time series is multiplied by $\sin(\phi_M)$, which is then low pass filtered and downsampled by functional unit 108. Functional unit 108 has the same transfer function as functional unit 106. For some embodiments, a single functional unit may be used in a multiplexed fashion to implement the functional units of 106 and 108. For some embodiments, the cosine and sine terms may be evaluated by a table loop-up, with the model phase $\phi_M$ as an index (key) to a table entry, so that functional units 103 and 105 may be implemented by lookups into a cosine table and sine table, respectively.

The output of functional unit 108 may also be viewed as an error term because it is provided to a feedback loop comprising controller 110 and phase generator 102. Although not necessary to the description of the embodiments, it is pedagogically useful to consider the physical significance of this error term by ignoring for the moment that the input analog signal has been digitized and by ignoring that operations are performed in the digital domain. With this simplification in mind, if one considers a continuous-time input signal $\sin(\phi)$ and continuous-time modeling phase $\phi_M$, then the error term, which is the low-pass filtered quadrature component of the term $\sin(\phi)\sin(\phi_M)$, is given by $\sin(\phi-\phi_M)\approx\phi-\phi_M$, assuming that $\phi-\phi_M$ is small. Consequently, the error term may be viewed as the phase difference $\phi-\phi_M$.

Returning back to a description of the embodiment of FIG. 1, functional unit 110 provides a correction term, denoted in FIG. 1 as $\Delta\omega$, in response to the error term. For some embodiments, functional unit 110 may be implemented as a table look-up. For some embodiments, the correction term may be evaluated by multiplying the error term by a scalar. This correction term is added to an initial phase rate estimate $\omega_0$, provided by functional unit 112, to provide a phase rate term ω. (This phase rate term is not to be confused with the use of ω in the pure tone A sin (ωt+φ) example discussed previously.)

Phase generator 102 generates the phase term $\phi_M$ in response to the phase rate term ω. The phase term $\phi_M$ may be viewed as a time integration of the phase rate term ω, where because the operations are performed in the digital domain, the integration may be viewed as a multiplication by a discrete time index. That is, if an integer m keeps track of the number of clock cycles for phase generator 102, then for some embodiments $\phi_M = \omega n$.

Because of the feedback loop comprising functional units 106, 108, 110, the (model) phase term $\phi_M$ tends to track the phase of the input signal. However, utilizing the inphase component (the output of functional unit 106) in addition to the phase term $\phi_M$ provides additional accuracy in estimating the phase of the input signal. The inphase and quadrature components are provided to arctan 114. As its name implies, arctan 114 evaluates the arctangent of the quotient obtained by dividing the quadrature component by the inphase component, i.e., arctan(Q/I). This result may be termed a residual phase, denoted as Δφ in FIG. 1. This residual phase is added to $\phi_M$, and the result is low pass filtered and downsampled by functional unit 116 to provide the estimate $\hat{\phi}$. Some embodiments may not perform low pass filtering, downsampling, or both, so that for some embodiments, $\hat{\phi} = \phi_M + \Delta\phi$.

Although not necessary to the description of the embodiments, it is pedagogically useful to consider the physical significance of the residual phase Δφ by again ignoring for the moment that the input analog signal has been digitized and by ignoring that operations are performed in the digital domain. With this simplification in mind, if one considers again a continuous-time input signal sin(φ) and continuous-time modeling phase $\phi_M$, then $$\frac{Q}{I} = \frac{\sin(\phi - \phi_M)}{\cos(\phi - \phi_M)} = \tan(\phi - \phi_M),$$

so that $\Delta\phi = \phi - \phi_M$, which is recognized as a residual phase term. Of course, these expressions are not exactly satisfied by an embodiment, but are presented merely to understand the physical significance of the residual phase term and are not meant to describe the embodiment.

Returning now to a description of the embodiments, the use of decimation (downsampling) filters allows for more than one clock domain. For example, for some embodiments, analog-to-digital converter 118, and functional units 102, 103, 104, 105, 106, 107, and 108 may operate at the highest clock rate; and the other functional units may operate at a lower clock rate. A potential source of error may be due to aliasing of noise during downsampling. This source of error may be mitigated by using digital anti-aliasing filters. For some embodiments, such aliasing filters are phase stable and linear in their passband.

For some applications, the signal band may be very small compared to the heterodyne frequency, so that noise near the sampling frequency and its harmonics may alias into the signal band. As an example, for gravitational-wave observation experiments, the signal band may be from 1 mHz to 1 Hz, so that for decimating from 10 kHz to 100 Hz, only noise near 10 kHz and its harmonics is expected to alias into the single band. For some embodiments for such applications, by placing nulls of the low pass and downsampling filter (e.g., functional units 106 and 108) at the sampling rate and its harmonics, aliasing of noise into the small signal band may be mitigated.

For some embodiments, the low pass and downsampling filters 106 and 108 may be Bartlett triangular filters, which may be implemented by convolving two top-hat functions. Because the low pass part is followed by a decimation (downsampling) stage, it is possible to save computations by calculating only the points that will be retained, reducing the number of calculations needed by the ratio of the output rate to the input rate.

Under certain conditions, such as when the quantization error of analog-to-digital converter 118 is smaller than the other noise on the input signal, and when the signal frequency divided by the sampling frequency is not a rational number, it may be shown that the root power spectral density phase noise, $\phi$, as a function of sampling rate, $f_s$, and number of bits N, is $$\phi = (\pi 2^N \sqrt{6 f_s})^{-1}.$$

However, because the signal frequency may sweep through frequencies which are rational divisors of the clock, and the amplitude may not be exactly between two bit transitions, the above expression may not hold. To help mitigate phase noise, a small amount of noise in the least significant bit may be added for some embodiments. To generate such introduced noise, a pseudo-random number generator based on a linear shift feedback register, and a triangular distribution, may be used in some embodiments to dither the least significant bit.

For some embodiments, the initial phase rate estimate provided by functional unit 112 may be based on counting the zero crossings of the input signal. For some embodiments, the initial phase estimate may be entered manually, and for some embodiments, the carrier signal's zero-crossing frequency may be added to a modulation offset frequency. Some embodiments may also include an automatic gain control to multiply the signal up to maximize the number of bits used in the calculation of the inphase and quadrature components.

Figure 2:
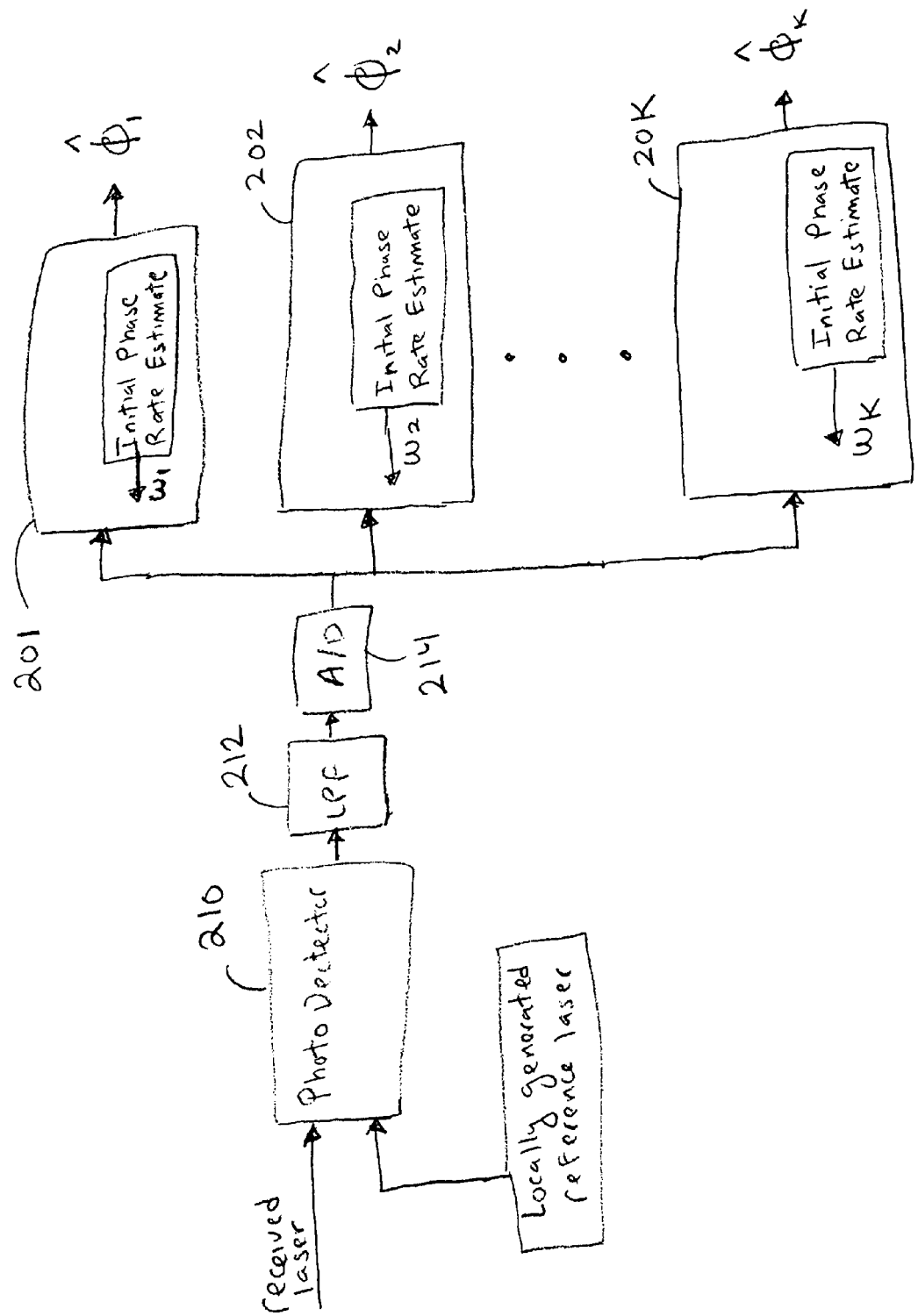
FIG. 2 illustrates a phasemeter for multi-tone input signals according to an embodiment of the present invention.

In some applications, the input signal may comprise more than one tone. To provide phase estimates for multi-tone input signals, the embodiment of FIG. 1 may be replicated, but where each replication has a different initial phase rate estimate. FIG. 2 illustrates such an embodiment, where there are K replications, and each box 201, 202, and 20 K is a replication with a different initial phase estimate. For some embodiments, the approach for choosing the different initial phase estimates may be as discussed above with respect to the single-tone input signal. For some embodiments, a Fourier spectrum of the input signal may be evaluated, and the various initial phase estimates may be based upon recognizing the different peaks in the frequency domain. Other embodiments may employ other techniques for providing the various initial phase estimates, whether for the multi-tone case or the single-tone case. The above-described techniques are merely specific examples.

FIG. 2 also illustrates a space application of an embodiment for measurement of gravity waves, where a received laser and a locally generated reference laser are provided as inputs to photodetector 210, followed by low pass filter 212. The resulting signal provided to analog-to-digital converter 214 is a heterodyne interference signal (at the heterodyne frequency).

The various components and functional units described and illustrated in the various embodiments may be realized in hardware, software, or firmware. For example, some or all functional units may be implemented in one or more Field Programmable Gate Arrays (FPGA), one or more Application Specific Integrated Circuits (ASIC), or some combination thereof. For some embodiments, one or more different clock domains may be utilized.

Although the subject matter has been described in language specific to structural features and methodological acts, it is to be understood that the subject matter defined in the appended claims is not necessarily limited to the specific features or acts described above. Rather, the specific features and acts described above are disclosed as example forms of implementing the claims. Accordingly, various modifications may be made to the described embodiments without departing from the scope of the invention as claimed below.

Throughout the description of the embodiments, various mathematical relationships are used to describe relationships among one or more quantities. For example, a mathematical relationship or mathematical transformation may express a relationship by which a quantity is derived from one or more other quantities by way of various mathematical operations, such as addition, subtraction, multiplication, division, etc. Or, a mathematical relationship may indicate that a quantity is larger, smaller, or equal to another quantity. These relationships and transformations are in practice not satisfied exactly, and should therefore be interpreted as "designed for" relationships and transformations. One of ordinary skill in the art may design various working embodiments to satisfy various mathematical relationships or transformations, but these relationships or transformations can only be met within the tolerances of the technology available to the practitioner.

Accordingly, in the following claims, it is to be understood that claimed mathematical relationships or transformations can in practice only be met within the tolerances or precision of the technology available to the practitioner, and that the scope of the claimed subject matter includes those embodiments that substantially satisfy the mathematical relationships or transformations so claimed.

What is claimed is:

1. An apparatus comprising electronic components to:
    multiply an input time series by a sine series to provide a first output;
    low pass filter the first output to provide a quadrature component;
    provide a model phase in response to the quadrature component, where the sine series is based on the model phase;
    multiply the input time series by a cosine series, the cosine series based on the model phase, to provide a second output;
    low pass filter the second output to provide an inphase component;
    provide a residual phase based on the arctangent of the quadrature component divided by the inphase component; and
    add the residual phase to the model phase.

2. The apparatus as set forth in claim 1, further comprising electronic components to:
    provide a correction phase rate in response to the quadrature component;
    add the correction phase rate to an initial phase rate estimate to provide a phase rate; and
    generate the model phase in response to the phase rate.

3. The apparatus as set forth in claim 2, the apparatus further comprising electronic components to downsample when performing the low pass filtering of the first output and when performing the low pass filtering of the second output.

4. The apparatus as set forth in claim 1, the apparatus further comprising electronic components to downsample when performing the low pass filtering of the first output and when performing the low pass filtering of the second output.

5. The apparatus as set forth in claim 1, further comprising a sine table and a cosine table, wherein the sine and cosine series are obtained from a table with the model phase as a key to the table.

6. The apparatus as set forth in claim 1, wherein the electronic components are implemented in a field programmable gate array.

7. A method comprising:
    multiplying an input time series by a sine series to provide a first output;
    low pass filtering the first output to provide a quadrature component;
    providing a correction phase rate in response to the quadrature component;
    adding the correction phase rate to an initial phase rate estimate to provide a phase rate;
    generating the model phase in response to the phase rate, where the sine series is based on the model phase;
    multiplying the input time series by a cosine series, the cosine series based on the model phase, to provide a second output;
    low pass filtering the second output to provide an inphase component;
    providing a residual phase based on the arctangent of the quadrature component divided by the inphase component; and
    adding the residual phase to the model phase.

8. The method as set forth in claim 7, wherein low pass filtering the first output comprises downsampling, and wherein low pass filtering the second output comprises downsampling.

9. The method as set forth in claim 7, further comprising looking up a sine table with the model phase as a key to provide the sine series, and looking up a cosine table with the model phase as a key to provide the cosine series.

* * * * *